(12) United States Patent
Yuan et al.

(10) Patent No.: US 10,436,857 B2
(45) Date of Patent: Oct. 8, 2019

(54) MAGNETIC FIELD SENSING APPARATUS AND SENSING METHOD THEREOF

(71) Applicants: Fu-Te Yuan, New Taipei (TW); Pei-Chun Kao, New Taipei (TW); Meng-Huang Lai, New Taipei (TW)

(72) Inventors: Fu-Te Yuan, New Taipei (TW); Pei-Chun Kao, New Taipei (TW); Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 148 days.

(21) Appl. No.: 15/719,586

(22) Filed: Sep. 29, 2017

(65) Prior Publication Data

US 2018/0238973 A1 Aug. 23, 2018

Related U.S. Application Data

(60) Provisional application No. 62/462,354, filed on Feb. 23, 2017.

(30) Foreign Application Priority Data

Jul. 11, 2017 (TW) .............................. 106123158 A

(51) Int. Cl.
*G01R 33/09* (2006.01)
(52) U.S. Cl.
CPC .................... *G01R 33/096* (2013.01)
(58) Field of Classification Search
CPC .................................................. G01R 33/096
See application file for complete search history.

(56) References Cited

U.S. PATENT DOCUMENTS

| 8,587,299 B2 | 11/2013 | van Veldhoven et al. |
| 2012/0153936 A1* | 6/2012 | Romani ............. G01R 33/0035 324/202 |
| 2015/0260805 A1 | 9/2015 | Miura et al. |

FOREIGN PATENT DOCUMENTS

| CN | 103703382 | 4/2014 |
| CN | 104246445 | 12/2014 |

(Continued)

OTHER PUBLICATIONS

"Office Action of Taiwan Counterpart Application", dated Jan. 18, 2018, p. 1-p. 5, in which the listed references were cited.

*Primary Examiner* — Clayton E. LaBalle
*Assistant Examiner* — Jas A Sanghera
(74) *Attorney, Agent, or Firm* — JCIPRNET

(57) ABSTRACT

A magnetic field sensing apparatus and a sensing method are provided. The magnetic field sensing apparatus includes an anisotropic magnetoresistive (AMR) resistor, a current generator, and an arithmetic device. The AMR resistor is configured to provide a first resistance value according to a sensed magnetic field in a first magnetic field sensing phase and provide a second resistance value according to the sensed magnetic field in a second magnetic field sensing phase by a magnetized direction setting operation. The current generator provides a current based on a current direction to flow through two ends of the AMR resistor. The arithmetic device is configured to perform an arithmetic operation with respect to a first voltage difference and a second voltage difference generated according to the current respectively in the first magnetic field sensing phase and the second magnetic field sensing phase, and generate a magnetic field sensing voltage result accordingly.

16 Claims, 8 Drawing Sheets

(56) References Cited

FOREIGN PATENT DOCUMENTS

| | | |
|---|---|---|
| CN | 105785290 | 7/2016 |
| JP | 2014016346 | 1/2014 |
| TW | 487169 | 5/2002 |
| TW | 201337302 | 9/2013 |
| TW | I487928 | 6/2015 |

\* cited by examiner

MAGNETIC FIELD SENSING APPARATUS AND SENSING METHOD THEREOF

CROSS-REFERENCE TO RELATED APPLICATION

This application claims the priority benefit of U.S. provisional application Ser. No. 62/462,354, filed on Feb. 23, 2017 and Taiwan application serial no. 106123158, filed on Jul. 11, 2017. The entirety of each of the above-mentioned patent applications is hereby incorporated by reference herein and made a part of this specification.

BACKGROUND OF THE INVENTION

Field of the Invention

The invention relates to a magnetic field sensing apparatus and a sensing method thereof, and more particularly relates to a magnetic field sensing apparatus composed of an anisotropic magnetoresistive resistor and a sensing method thereof.

Description of Related Art

A magnetic field sensing apparatus is an elementary apparatus for providing a compass and a motion tracking system. For portable systems, such as smart phones, tablets, smart watches, and commercial or industrial systems (e.g., drones), the magnetic field sensing apparatus needs to be very accurate, has a small package size, and saves power while maintains data rate at high output. In view of such requirements, magnetoresistive sensors, including anisotropic magnetoresistive (AMR), giant magnetoresistive (GMR), and tunneling magnetoresistive (TMR) sensors, have become the mainstream. The anisotropic magnetoresistive (AMR) sensor is the earliest developed magnetoresistive technology. Although the anisotropic magnetoresistive (AMR) sensor is less sensitive than giant magnetoresistive (GMR) and tunneling magnetoresistive (TMR) sensors, it has advantages in low production costs, less magnetic lag, and bidirectional magnetic setting operation mode and therefore is still competitive.

In the conventional technology, the anisotropic magnetoresistive (AMR) sensor is based on a complete Wheatstone bridge structure. However, the anisotropic magnetoresistive (AMR) sensor with the Wheatstone bridge structure requires four anisotropic magnetoresistive resistors, which will raise the production costs and take up a larger design layout area.

SUMMARY OF THE INVENTION

The invention provides a magnetic field sensing apparatus and a sensing method thereof for lowering production costs and reducing a design layout area.

The magnetic field sensing apparatus of the invention includes an anisotropic magnetoresistive (AMR) resistor, a current generator, and an arithmetic device. The anisotropic magnetoresistive resistor is configured to provide a first resistance value according to a sensed magnetic field in a first magnetic field sensing phase and provide a second resistance value according to the sensed magnetic field in a second magnetic field sensing phase by a magnetized direction setting operation, and the first resistance value and the second resistance value are different. The current generator is coupled to the anisotropic magnetoresistive resistor and configured to provide a current to flow through two ends of the anisotropic magnetoresistive resistor according to a current direction. The arithmetic device has a first input end and a second input end that are respectively coupled to the two ends of the anisotropic magnetoresistive resistor, and is configured to perform an arithmetic operation on a first voltage difference and a second voltage difference which are generated by the anisotropic magnetoresistive resistor according to the current respectively in the first magnetic field sensing phase and the second magnetic field sensing phase, and generate a magnetic field sensing voltage result accordingly.

The magnetic field sensing method of the invention includes: providing a current to flow through two ends of an anisotropic magnetoresistive resistor according to a current direction; configuring the anisotropic magnetoresistive resistor to provide a first resistance value according to a sensed magnetic field and generate a first voltage difference according to the current in a first magnetic field sensing phase by a magnetized direction setting operation; configuring the anisotropic magnetoresistive resistor to provide a second resistance value according to the sensed magnetic field and generate a second voltage difference according to the current in a second magnetic field sensing phase by the magnetized direction setting operation; and performing an arithmetic operation according to the first voltage difference and the second voltage difference, and generating a magnetic field sensing voltage result accordingly.

Based on the above, the magnetic field sensing apparatus of the invention configures one anisotropic magnetoresistive resistor to provide the first resistance value according to the sensed magnetic field in the first magnetic field sensing phase by the magnetized direction setting operation, and the arithmetic device generates the first voltage difference of the first magnetic field sensing phase according to an additional current. The second resistance value is provided according to the sensed magnetic field in the second magnetic field sensing phase, and the arithmetic device generates the second voltage difference of the second magnetic field sensing phase according to the additional current. The arithmetic device generates the magnetic field sensing voltage result according to the first and second voltage differences. Accordingly, the voltage offset in the magnetic field sensing apparatus is compensated to reduce the influence of environmental interference. By performing the sensing in two phases, the circuit area of the magnetic field sensing apparatus of the embodiments of the invention is effectively reduced to lower the circuit costs.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
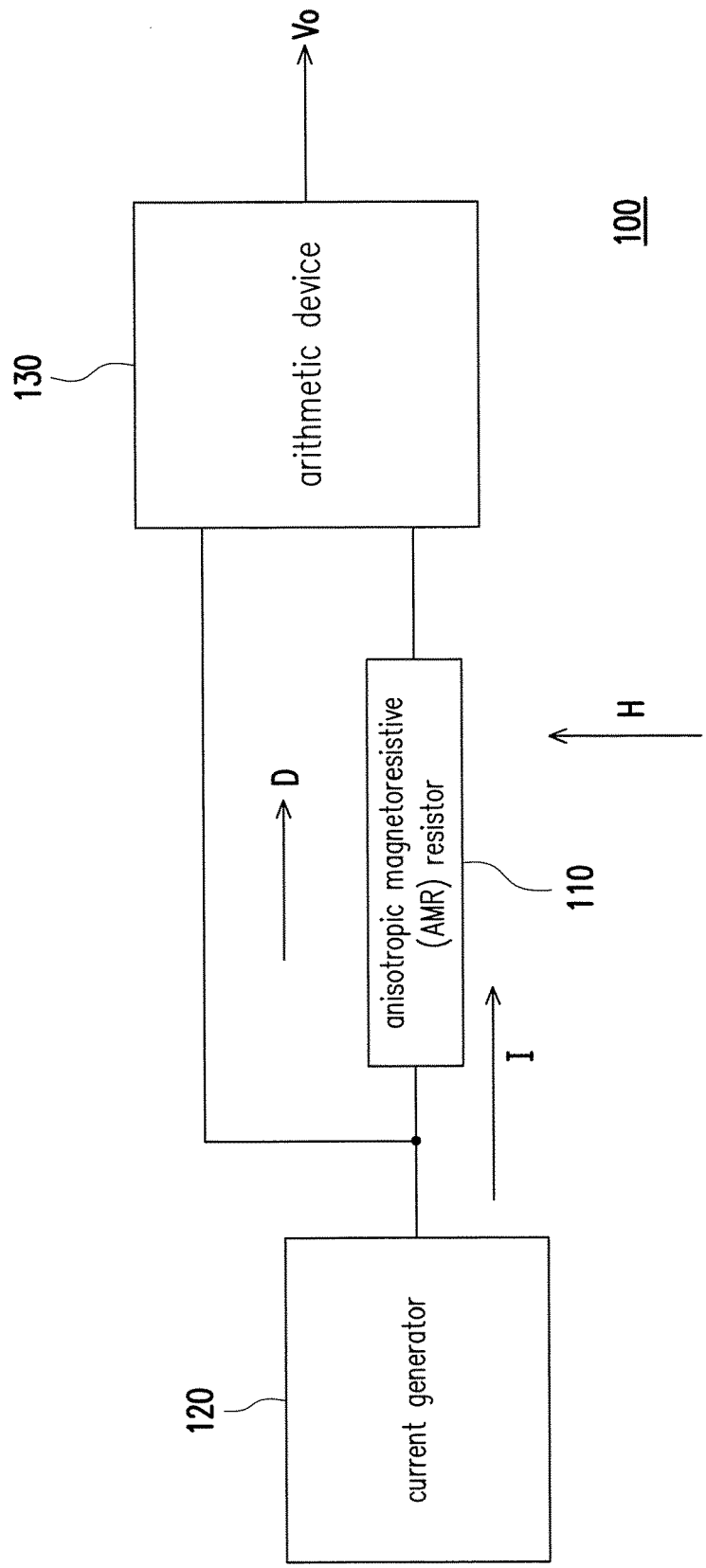
FIG. 1 is a diagram showing a magnetic field sensing apparatus according to the first embodiment of the invention.

Referring to FIG. 1, FIG. 1 is a diagram of a magnetic field sensing apparatus according to an embodiment of the invention. The magnetic field sensing apparatus 100 includes an anisotropic magnetoresistive (AMR) resistor 110, a current generator 120, and an arithmetic device 130. The anisotropic magnetoresistive resistor 110 is configured to provide a first resistance value and a second resistance value according to a sensed magnetic field He by a magnetized direction setting operation. The current generator 120 is coupled to the anisotropic magnetoresistive resistor 110 and provides a current I to flow through two ends of the anisotropic magnetoresistive resistor 110 according to a current direction D. The arithmetic device 130 has arithmetic device input ends respectively coupled to the two ends of the anisotropic magnetoresistive resistor 110 and is configured to perform an arithmetic operation on a first voltage difference and a second voltage difference which are generated according to the current I and the first resistance value and the second resistance value provided by the anisotropic magnetoresistive resistor, and generate a magnetic field sensing voltage result Vo accordingly.

In the embodiment of FIG. 1, the anisotropic magnetoresistive resistor 110 may have a barber pole-shaped structure and have a main body composed of a ferromagnetic film. In other words, a surface of the anisotropic magnetoresistive resistor 110 is provided with a plurality of groups of shorting bars that extend obliquely with respect to an extension direction of the anisotropic magnetoresistive resistor, and the shorting bars are spaced from one another and arranged in parallel on the main body. Nevertheless, the invention is not limited thereto.

Figure 2:
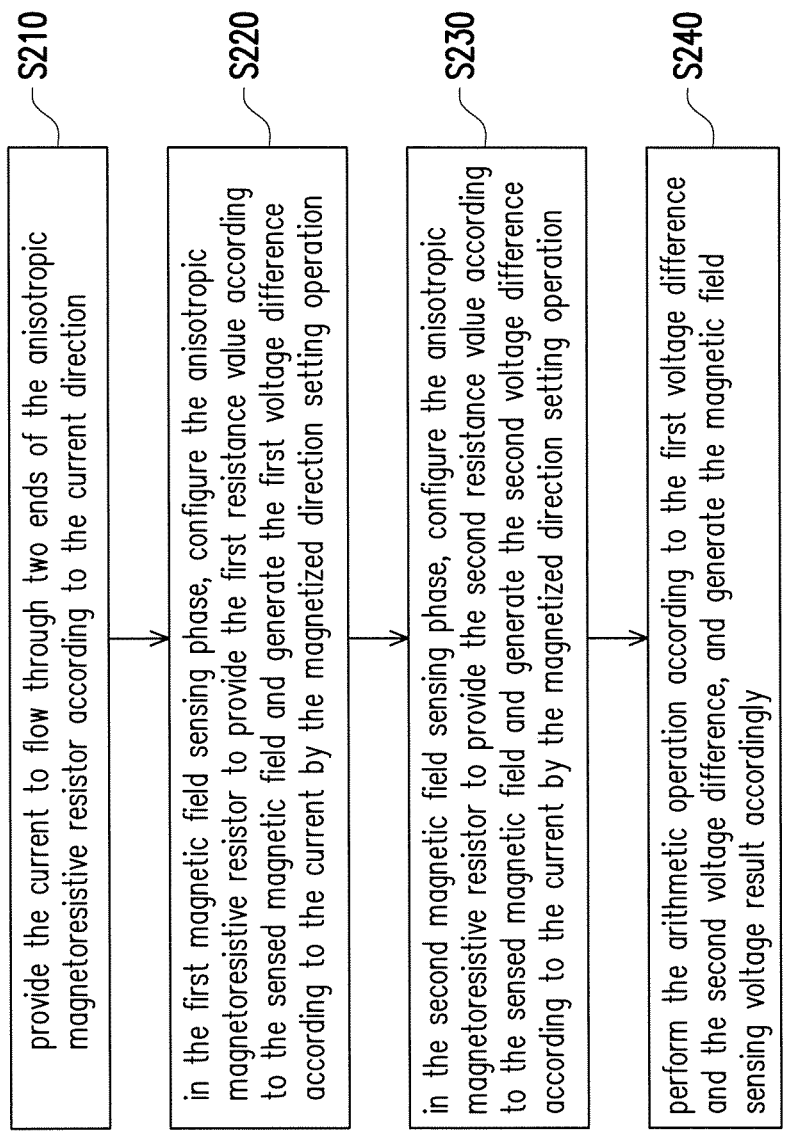
FIG. 2 is a flowchart showing a magnetic field sensing method according to an embodiment of the invention.

An operation method of the magnetic field sensing apparatus is described hereinafter. FIG. 2 is a flowchart showing a magnetic field sensing method according to an embodiment of the invention. Referring to FIG. 1 and FIG. 2, in Step S210, the current generator 120 provides the current I, which flows through the two ends of the anisotropic magnetoresistive resistor 110 according to the current direction D. Next, sensing of the sensed magnetic field He starts. In the embodiment of FIG. 1 and FIG. 2, the operation of sensing the sensed magnetic field H may be divided into a first magnetic field sensing phase and a second magnetic field sensing phase based on time. In Step S220, the magnetic field sensing apparatus 100 performs the first magnetic field sensing phase, in which the magnetized direction setting operation is performed on the anisotropic magnetoresistive resistor 110 to set a magnetized direction of the anisotropic magnetoresistive resistor 110 to a first direction, such that the anisotropic magnetoresistive resistor 110 provides the first resistance value according to the sensed magnetic field H and generates the first voltage difference according to the current I provided by the current generator 120. In Step S230, the magnetic field sensing apparatus 100 performs the second magnetic field sensing phase. In the second magnetic field sensing phase, the magnetized direction setting operation is performed on the anisotropic magnetoresistive resistor 110 first to set the magnetized direction of the anisotropic magnetoresistive resistor 110 to a second direction, such that the anisotropic magnetoresistive resistor 110 provides the second resistance value according to the sensed magnetic field H and generates the second voltage difference according to the current I provided by the current generator 120. The first direction and the second direction are opposite to each other.

Then, in Step S240, the arithmetic device 130 performs an arithmetic operation according to the first voltage difference that the anisotropic magnetoresistive resistor 110 provides in the first magnetic field sensing phase and the second voltage difference that the anisotropic magnetoresistive resistor 110 provides in the second magnetic field sensing phase, and generates the magnetic field sensing voltage result Vo accordingly.

Regarding the magnetized direction setting operation described in this embodiment, the anisotropic magnetoresistive resistor 110 may perform the magnetized direction setting operation by a magnetized direction setting component respectively in the first magnetic field sensing phase and the second magnetic field sensing phase. The magnetized direction setting component may be disposed adjacent to the anisotropic magnetoresistive resistor, but not particularly limited thereto. Referring to FIG. 1 and FIG. 2, through setting of the magnetized direction setting component (not shown), the magnetized direction of the anisotropic magnetoresistive resistor 110 is set to a first setting direction in Step S220, and the magnetized direction of the anisotropic magnetoresistive resistor 110 is set to a second setting direction in Step S230. The first setting direction and the second setting direction may be opposite directions.

Referring to FIG. 1 and FIG. 2, in Step S220, the magnetized direction of the anisotropic magnetoresistive resistor 110 in the first magnetic field sensing phase may be the same as the current direction D of the current I provided by the current generator 120, and in Step S230, the magnetized direction of the anisotropic magnetoresistive resistor 110 in the second magnetic field sensing phase may be opposite to the current direction D of the current I provided by the current generator 120. However, the above is merely an example. In other embodiments of the invention, the first setting direction in the first magnetic field sensing phase may be opposite to the current direction D, and the second setting direction in the second magnetic field sensing phase may be the same as the current direction D.

When the anisotropic magnetoresistive resistor 110 has not received the sensed magnetic field H, the anisotropic magnetoresistive resistor 110 maintains a fixed original resistance value. When the anisotropic magnetoresistive resistor 110 receives the sensed magnetic field H, the resistance value of the anisotropic magnetoresistive resistor 110 changes with the sensed magnetic field H. For example, when the first resistance value R1 provided by the anisotropic magnetoresistive resistor 110 in the first magnetic field sensing phase is affected by the sensed magnetic field H, the first resistance value R1 increases, such that R1=R0+ΔR. R0 is the original resistance value and ΔR is the change value. Because the anisotropic magnetoresistive resistor 110 has opposite magnetized directions in the first magnetic field sensing phase and the second magnetic field sensing phase, the second resistance value R2 provided by the anisotropic magnetoresistive resistor 110 in the second magnetic field sensing phase decreases correspondingly due to influence of the same sensed magnetic field H, that is, the second resistance value R2 decreases, such that R2=R0−ΔR. On the other hand, when the first resistance value provided by the anisotropic magnetoresistive resistor 110 in the first magnetic field sensing phase decreases due to influence of the sensed magnetic field H, the second resistance value provided in the second magnetic field sensing phase increases correspondingly.

Moreover, when the anisotropic magnetoresistive resistor 110 receives the sensed magnetic field H, the current generator 120 provides the current I for the current I to flow through the two ends of the anisotropic magnetoresistive resistor 110 having the first resistance value according to the current direction D, such that the anisotropic magnetoresistive resistor 110 generates the first voltage difference corresponding to the first resistance value in the first magnetic field sensing phase. In addition, in the second magnetic field sensing phase, the anisotropic magnetoresistive resistor 110 having the second resistance value generates the second voltage difference corresponding to the second resistance value. The arithmetic device 130 is coupled to the two ends of the anisotropic magnetoresistive resistor 110 to respectively receive the first and second voltage differences in the first and second magnetic field sensing phases for performing the arithmetic operation (e.g., subtraction operation) according to the first and second voltage differences so as to generate the magnetic field sensing voltage result Vo.

Accordingly, the magnetic field sensing apparatus 100 described in this embodiment of the invention receives the first and second voltage differences by the arithmetic device 130 and performs the arithmetic operation to generate the magnetic field sensing voltage result Vo, so as to compensate for the voltage offset in the circuit of the arithmetic device 130 and thereby reduce influence of environmental interference. Moreover, by performing sensing in the time-division manner, the circuit area of the magnetic field sensing apparatus 100 of the embodiment of the invention is effectively reduced to lower the circuit costs.

Figure 3:
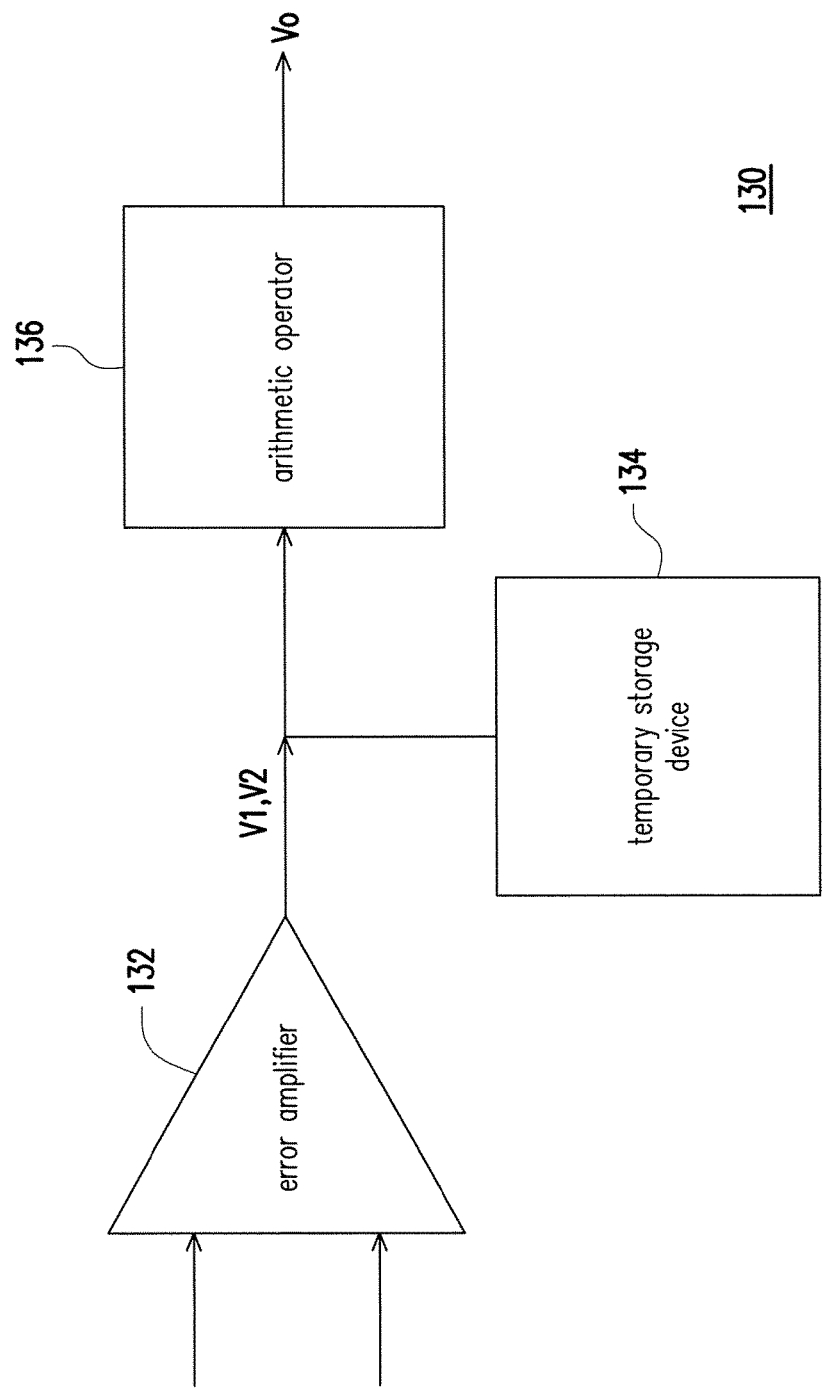
FIG. 3 is a diagram showing an arithmetic device according to an embodiment of the invention.

Referring to FIG. 3, FIG. 3 is a diagram showing the arithmetic device according to an embodiment of the invention. In the embodiment of FIG. 3, the arithmetic device 130 includes an error amplifier 132, a temporary storage device 134, and an arithmetic operator 136. An input end of the error amplifier 132 is respectively coupled to the two ends of the anisotropic magnetoresistive resistor for calculating a voltage difference V1 according to a voltage difference between the two ends of the anisotropic magnetoresistive resistor in the first magnetic field sensing phase. Moreover, the error amplifier 132 calculates a voltage difference V2 according to the voltage difference between the two ends of the anisotropic magnetoresistive resistor in the second magnetic field sensing phase. The temporary storage device 134 may be any type of volatile or non-volatile memory, or any data storage device known to those skilled in the art. The temporary storage device 134 is coupled to an output end of the error amplifier 132 for storing the voltage difference V1. The arithmetic operator 136 is coupled to the error amplifier 132 and the temporary storage device 134 for receiving the voltage difference V1 from the temporary storage device 134 and directly receiving the voltage difference V2 from the error amplifier 132, and performing the arithmetic operation with respect to the voltage difference V1 and the voltage difference V2 so as to generate the magnetic field sensing voltage result Vo. In other embodiments, the temporary storage device 134 may be configured to store the voltage difference V1 and the voltage difference V2, and the arithmetic operator 136 may read the voltage difference V1 and the voltage difference V2 from the temporary storage device 134 for performing the arithmetic operation to generate the magnetic field sensing voltage result Vo.

Figure 4:
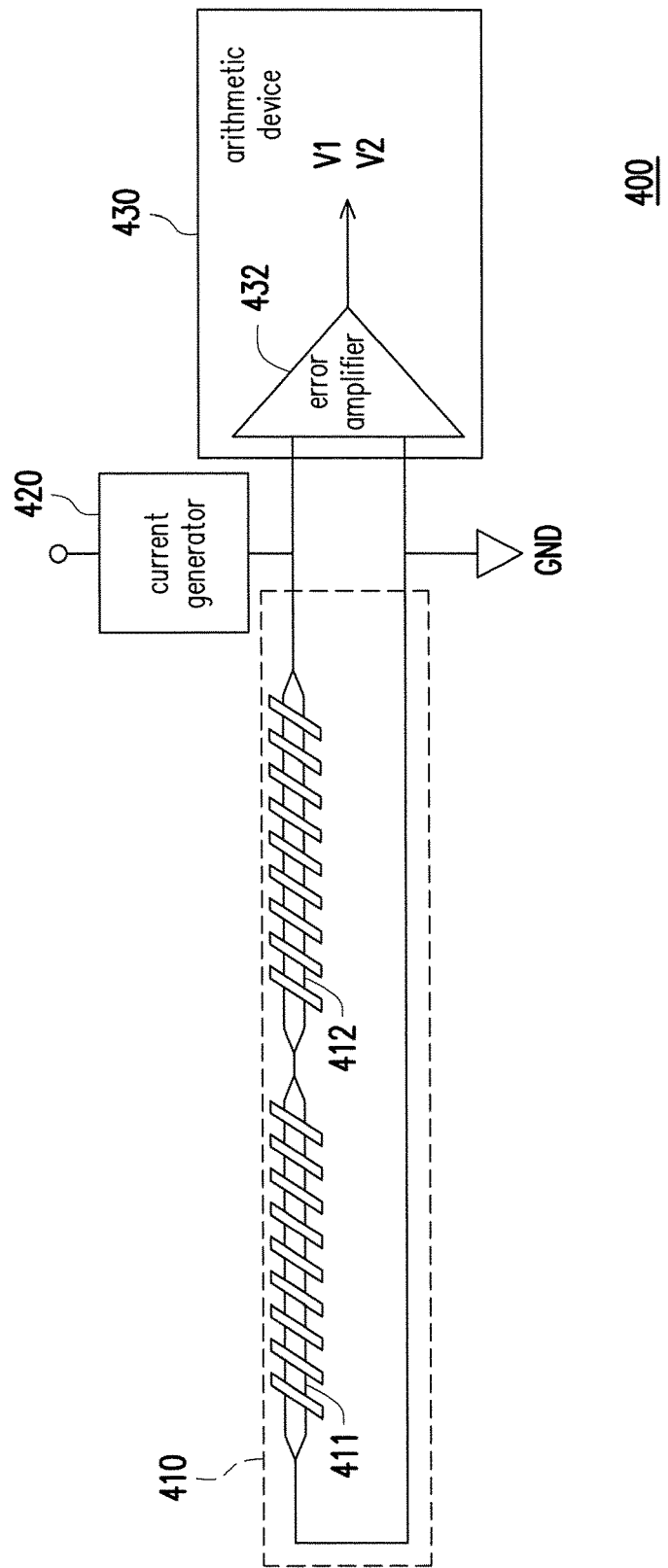
FIG. 4 is a diagram showing a magnetic field sensing apparatus according to the second embodiment of the invention.

FIG. 4 is a diagram showing the magnetic field sensing apparatus performing the first magnetic field sensing phase according to another embodiment of the invention. A difference between FIG. 4 and FIG. 1 is that, in the embodiment of FIG. 4, an anisotropic magnetoresistive resistor 410 includes sub-anisotropic magnetoresistive resistors 411 and 412 that are connected in series between a first input end and a second input end of an arithmetic device 430. In other words, the anisotropic magnetoresistive resistor 410 is a single magnetoresistive structure composed of the sub-anisotropic magnetoresistive resistors 411 and 412, and two ends of the anisotropic magnetoresistive resistor 410 are respectively coupled to two ends of the arithmetic device 430. A second input end of the arithmetic device 430 may be coupled to a ground reference potential GND.

In the embodiment of FIG. 4, in the first magnetic field sensing phase, the magnetized direction setting operation is performed, such that the sub-anisotropic magnetoresistive resistors 411 and 412 in the anisotropic magnetoresistive resistor 410 have the same or opposite magnetized directions and generate the first resistance value according to the sensed magnetic field, and the error amplifier 432 in the arithmetic device 430 generates the voltage difference V1 according to the current I provided by the current generator 420. The magnetized direction of the sub-anisotropic magnetoresistive resistor 411 is the same as or opposite to the current direction. Then, in the second magnetic field sensing phase, the magnetized direction setting operation is performed, such that the sub-anisotropic magnetoresistive resistors 411 and 412 in the anisotropic magnetoresistive resistor 410 have the same or opposite magnetized directions and generate the second resistance value according to the same sensed magnetic field, and the error amplifier 432 in the arithmetic device 430 generates the voltage difference V2 according to the current I provided by the current generator 420. The magnetized direction of each of the sub-anisotropic magnetoresistive resistors 411 and 412 in the first magnetic field sensing phase is opposite to that in the second magnetic field sensing phase. The arithmetic device 430 performs the arithmetic operation with respect to the voltage differences V1 and V2 so as to generate the magnetic field sensing voltage result.

Figure 5A:
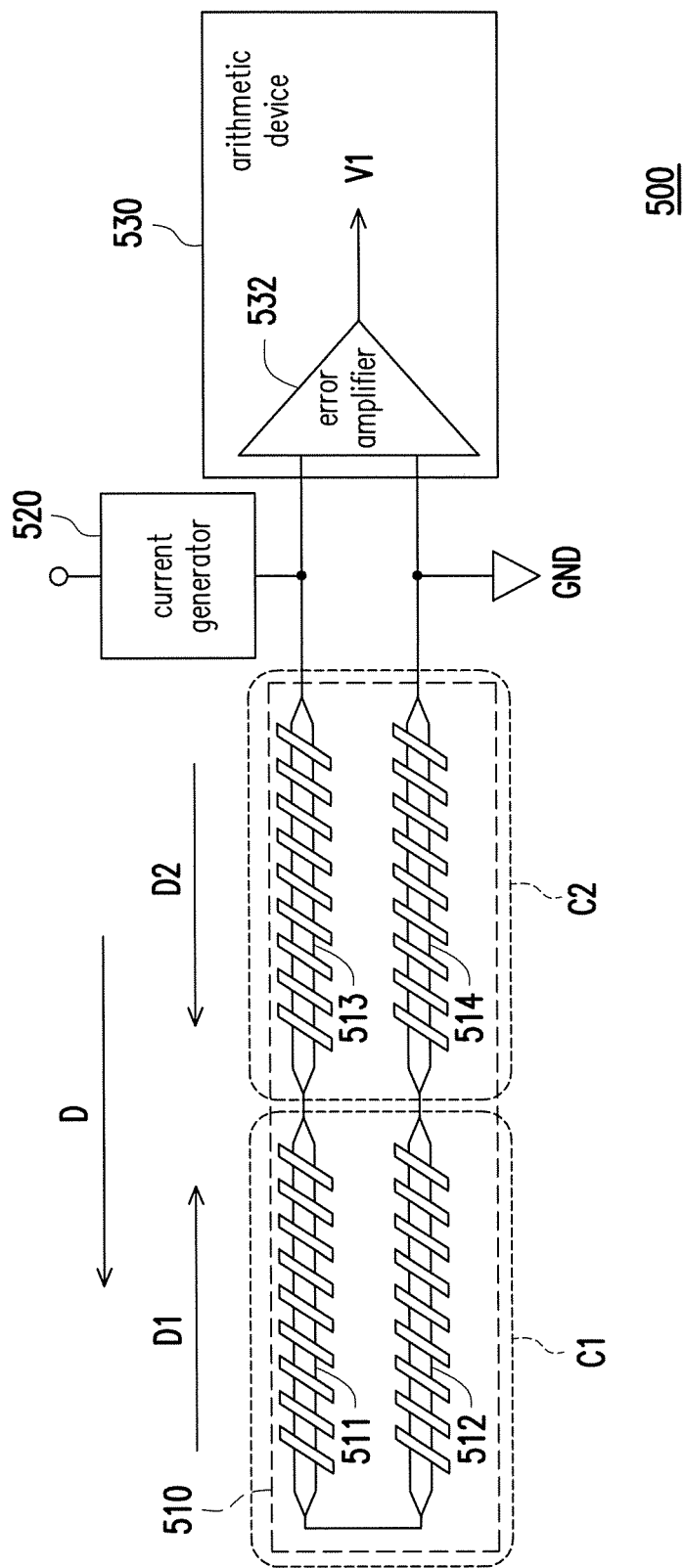
FIG. 5A and FIG. 5B are diagrams showing a magnetic field sensing apparatus according to the third embodiment of the invention.
Figure 5B:
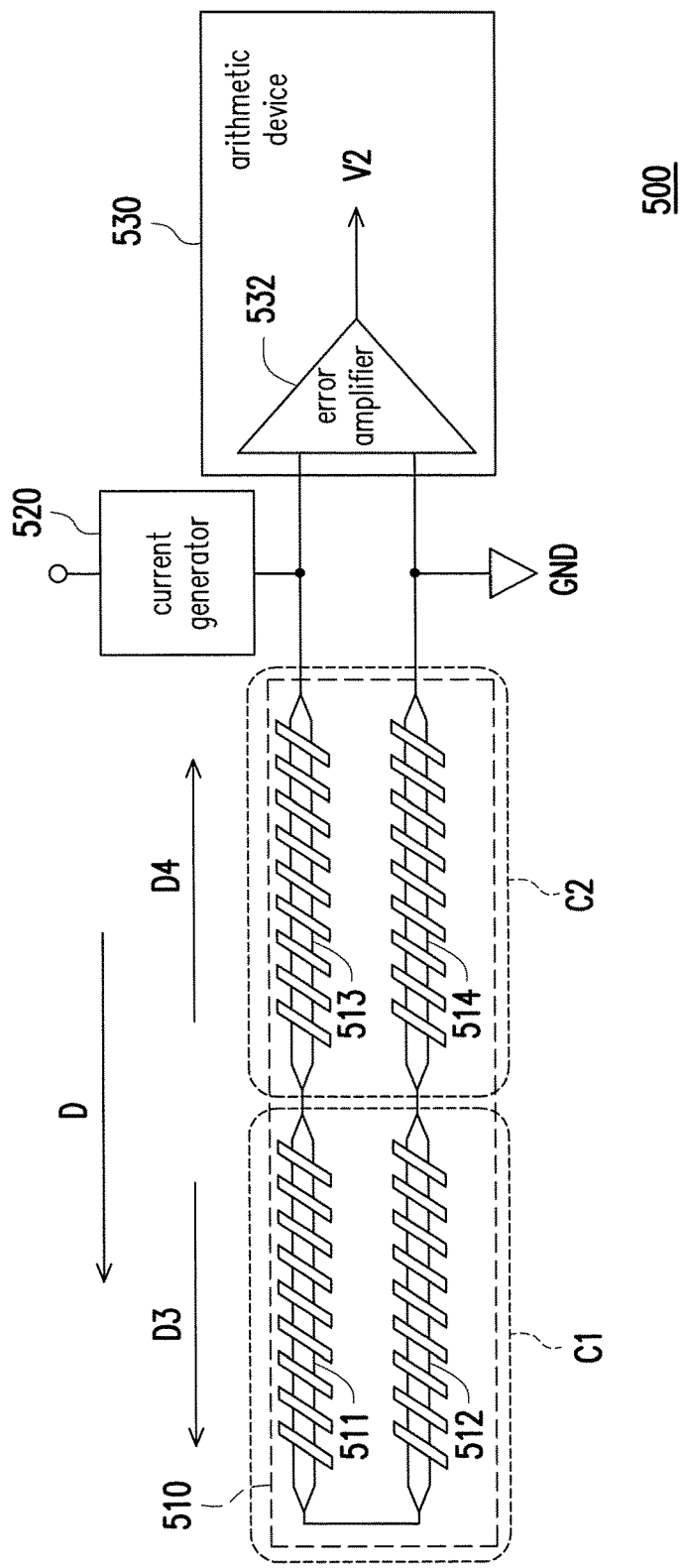

FIG. 5A and FIG. 5B are diagrams showing the magnetic field sensing apparatus according to another embodiment of the invention. A difference between the embodiment of FIG. 5A and FIG. 5B and the embodiments of FIG. 4 and FIG. 1 is that, in the embodiment of FIG. 5A and FIG. 5B, an anisotropic magnetoresistive resistor 510 in a magnetic field sensing apparatus 500 includes sub-anisotropic magnetoresistive resistors 511, 512, 513, and 514. The sub-anisotropic magnetoresistive resistors 511, 512, 513, and 514 are connected in series between the first input end and the second input end of the arithmetic device. In other words, the anisotropic magnetoresistive resistor 510 is a single magnetoresistive structure composed of the sub-anisotropic magnetoresistive resistors 511, 512, 513, and 514, and two ends of the anisotropic magnetoresistive resistor 510 are respectively coupled to two ends of the arithmetic device 530.

In this embodiment, the anisotropic magnetoresistive resistor 510 may be configured to dispose the sub-anisotropic magnetoresistive resistors 511 and 512 in a region C1 and dispose the sub-anisotropic magnetoresistive resistors 513 and 514 in a region C2. Nevertheless, the invention is not intended to limit the number of the sub-anisotropic magnetoresistive resistors, the order that they are connected in series, and the number of the regions.

Referring to FIG. 5A, FIG. 5A is a diagram showing the magnetic field sensing apparatus 500 performing the first magnetic field sensing phase according to this embodiment. In FIG. 5A, the magnetic field sensing apparatus 500 performs the first magnetic field sensing phase, and by the magnetized direction setting operation, the magnetized directions of the sub-anisotropic magnetoresistive resistors 511 and 512 in the region C1 are set to the first setting direction D1 and the magnetized directions of the sub-anisotropic magnetoresistive resistors 513 and 514 in the region C2 are set to the second setting direction D2. The anisotropic magnetoresistive resistor 510 is configured to provide the first resistance value according to the sensed magnetic field and generate the voltage difference V1 according to the current I provided by the current generator 520.

In this embodiment, the first setting direction D1 and the second setting direction D2 are opposite to each other, and the first setting direction D1 may be the same as or opposite to the current direction D. In other embodiments, the first setting direction D1 may be the same as the second setting direction D2.

Referring to FIG. 5B, FIG. 5B is a diagram showing the magnetic field sensing apparatus performing the second magnetic field sensing phase according to the same embodiment of FIG. 5A. In the second magnetic field sensing phase, the magnetic field sensing apparatus 500 sets the magnetized directions of the sub-anisotropic magnetoresistive resistors 511 and 512 in the region C1 to a third setting direction D3 and sets the magnetized directions of the sub-anisotropic magnetoresistive resistors 513 and 514 in the region C2 to a fourth setting direction D4 by the magnetized direction setting operation, such that the anisotropic magnetoresistive resistor 510 provides the second resistance value according to the sensed magnetic field and generates the voltage difference V2 according to the current I provided by the current generator 520. In this embodiment, the third setting direction D3 and the fourth setting direction D4 are opposite to each other. However, in other embodiments, the third setting direction D3 and the fourth setting direction D4 may be the same.

It should be noted that the third setting direction D3 and the first setting direction D1 are opposite to each other, and the fourth setting direction D4 and the second setting direction D2 are opposite to each other.

The following is described based on the embodiments of FIG. 5A and FIG. 5B. In the embodiment of the first magnetic field sensing phase of FIG. 5A, the first setting direction D1 and the second setting direction D2 are in a head to head opposite direction relationship, while in the embodiment of the second magnetic field sensing phase of FIG. 5B, the third setting direction D3 and the fourth setting direction D4 are in a tail to tail opposite direction relationship.

Regarding the hardware architecture of the error amplifier 532, any differential amplifier architecture known to those skilled in the art may be used as the error amplifier 532 of the invention without any particular limitation. Regarding the current generator 520, any current generator circuit known to those skilled in the art may be used as the current generator 520 of the invention without any particular limitation.

Figure 6A:
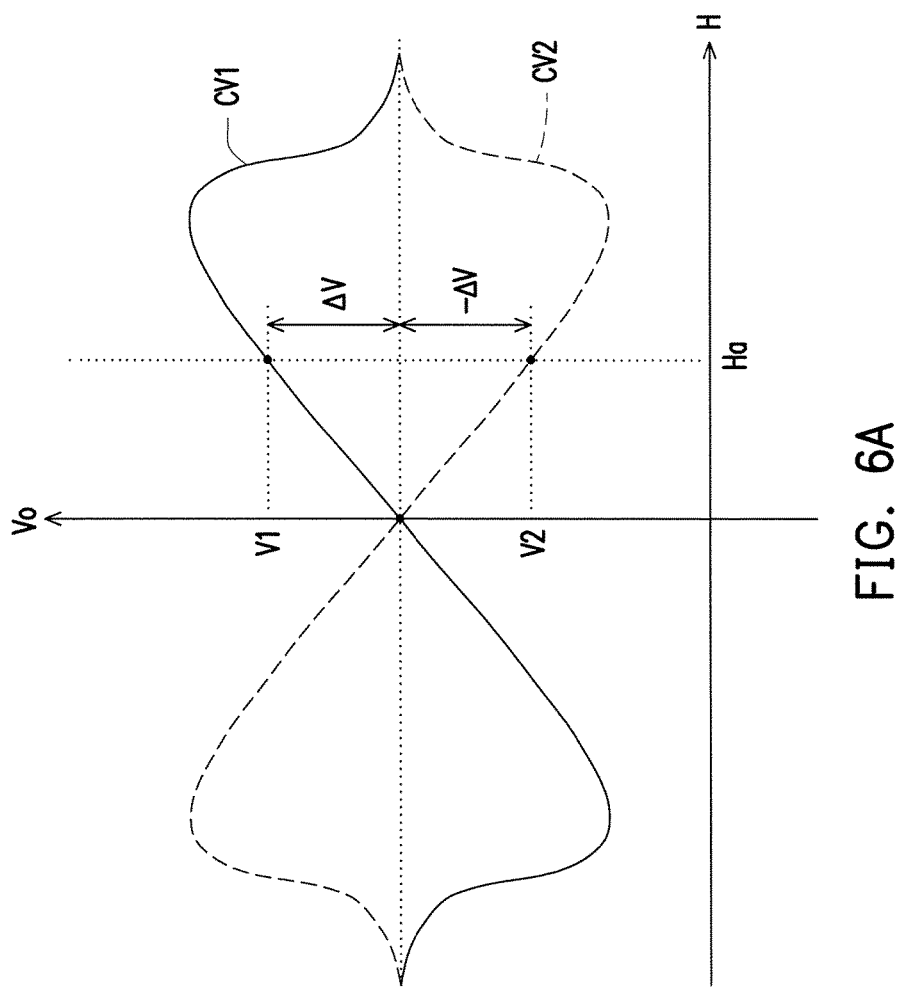
FIG. 6A is a waveform diagram of magnetic field sensing of a magnetic field sensing apparatus according to the third embodiment of the invention.

Referring to FIG. 6A, FIG. 6A is a waveform diagram of the magnetic field sensing of the magnetic field sensing apparatus according to the embodiments of FIG. 5A and FIG. 5B. In FIG. 6A, the vertical axis represents the voltage value of the first magnetic field sensing result VO, and the horizontal axis represents the magnitude of the sensed magnetic field H. Referring to FIG. 5A and FIG. 6A, when the magnetic field sensing apparatus 400 receives the sensed magnetic field H in the first magnetic field sensing phase and when the first setting direction and the second setting direction of the first magnetic field sensing phase are in the head to head opposite direction relationship, the magnitude of the sensed magnetic field H with a fixed range has a linear positive correlation with the first resistance value provided by the anisotropic magnetoresistive resistor 510, as indicated by the curve CV1. When it is sensed in the first magnetic field sensing phase that the sensed magnetic field H is equal to Ha, the error amplifier 532 in the arithmetic device 530 calculates the first voltage difference as V1=ΔV corresponding to the sensed magnetic field H equal to Ha by receiving the voltage difference between two ends of the anisotropic magnetoresistive resistor 510, and stores the result of the first voltage difference V1 to the temporary storage device.

It should be noted that the error amplifier calculates the first voltage difference V1 based on the voltage difference between two ends of the anisotropic magnetoresistive resistor 410, so as to reduce the system electrical offset and the influence of environmental interference in the first magnetic sensing phase and thereby improve sensing accuracy.

Further, referring to FIG. 5B and FIG. 6A, the sensed magnetic field H is received in the first magnetic field sensing phase, and when the first setting direction and the second setting direction of the second magnetic field sensing phase are in the tail to tail opposite direction relationship, the magnitude of the sensed magnetic field H has a linear negative correlation with the second resistance value provided by the anisotropic magnetoresistive resistor 510, as indicated by the curve CV2. When it is sensed in the second magnetic field sensing phase that the sensed magnetic field H is equal to Ha, the error amplifier 532 in the arithmetic device 530 calculates the second voltage difference as V2=−ΔV corresponding to the sensed magnetic field H equal to Ha by receiving the voltage difference between two ends of the anisotropic magnetoresistive resistor 410.

It should be noted that the error amplifier 532 calculates the second voltage difference V2 based on the voltage difference between two ends of the anisotropic magnetoresistive resistor 510, so as to reduce the system electrical offset and the influence of environmental interference in the first magnetic sensing phase and thereby improve sensing accuracy.

Figure 6B:
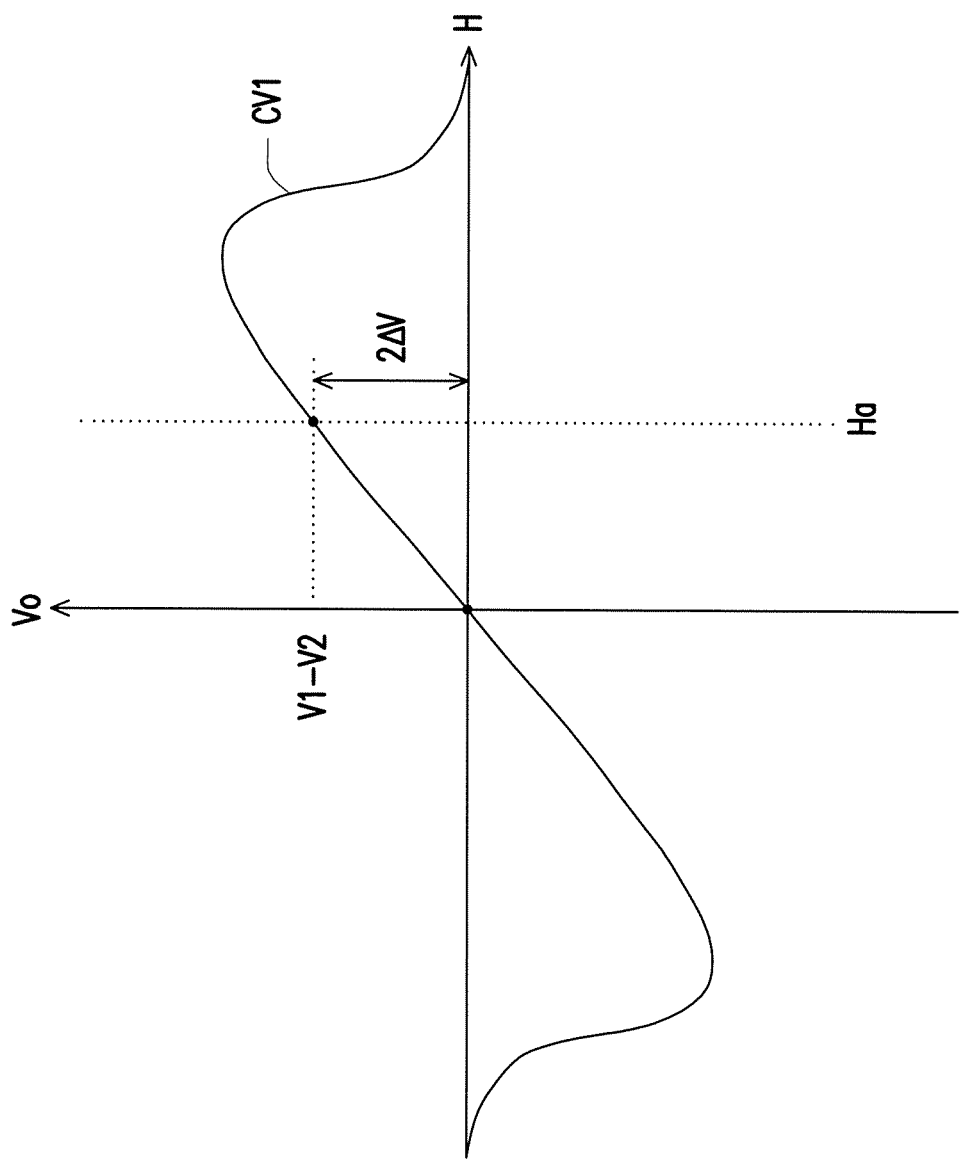
FIG. 6B is a waveform diagram of a magnetic field sensing result of the magnetic field sensing apparatus according to the third embodiment of the invention.

Referring to FIG. 6B, FIG. 6B is a waveform diagram of a magnetic field sensing result of the magnetic field sensing apparatus according to the embodiments of FIG. 5A and FIG. 5B. In FIG. 6B, the vertical axis represents the voltage value of the first magnetic field sensing result VO, and the horizontal axis represents the magnitude of the sensed magnetic field H. After the second magnetic field sensing phase is completed and the second voltage difference V2 is calculated, the arithmetic operator in the arithmetic device receives the first voltage difference V1 stored in the temporary storage device and the second voltage difference V2 from the error amplifier, and performs the arithmetic operation with respect to the first voltage difference V1 and the second voltage difference V2, so as to generate the magnetic field sensing voltage result Vo. In other embodiments, the result of the second voltage difference may be stored in the temporary storage device, and the arithmetic operator in the arithmetic device receives the first voltage difference and the second voltage difference stored in the temporary storage device, and performs the arithmetic operation with respect to the first voltage difference and the second voltage difference, so as to generate the magnetic field sensing voltage result.

The arithmetic operation performed for generating the magnetic field sensing voltage result is described in detail hereinafter. In the embodiments of FIG. 5A and FIG. 5B, the magnitude of the sensed magnetic field H has a nearly linear positive correlation with the first resistance value provided by the anisotropic magnetoresistive resistor 510 in the first magnetic field sensing phase, and the magnitude of the sensed magnetic field H has a nearly linear negative correlation with the second resistance value provided by the anisotropic magnetoresistive resistor 510 in the second magnetic field sensing phase. Thus, in the case of supply of the same current and current direction, the voltage difference V1 generated by the anisotropic magnetoresistive resistor 510 in the first magnetic field sensing phase and the voltage difference V2 generated in the second magnetic field sensing phase correspond to the magnitude of the sensed magnetic field H and present opposite waveforms. That is, if the voltage difference V1 is positive, the voltage difference V2 is negative. When the magnetic field Ha is sensed in the first magnetic field sensing phase and the second magnetic field sensing phase, the arithmetic operator in the arithmetic device may generate the first voltage difference V1=ΔV and the second voltage difference V2=−ΔV corresponding to the sensed magnetic field Ha. Therefore, the arithmetic operator in the arithmetic device may perform the arithmetic operation, including subtraction operation, with respect to the first voltage difference V1 and the second voltage difference V2, so as to obtain the magnetic field sensing voltage result as Vo=V1−V2=ΔV−(−ΔV)=2×ΔV and achieve a double output effect of the magnetic field sensing voltage result.

Here, it is worth mentioning that, in this embodiment, the arithmetic operation described above may further reduce the system electrical offset and the influence of environmental interference in the first magnetic field sensing phase and the second magnetic field sensing phase. Moreover, when the sensed magnetic field H is 0, the magnetic field sensing apparatus has substantially 0 output.

To sum up, the magnetic field sensing apparatus of the invention includes the anisotropic magnetoresistive (AMR) resistor, the current generator, and the arithmetic device. The magnetic field sensing apparatus configures one anisotropic magnetoresistive resistor to provide the first resistance value according to the sensed magnetic field in the first magnetic field sensing phase by the magnetized direction setting operation, and the arithmetic device generates the first voltage difference of the first magnetic field sensing phase according to the additional current provided by the current generator. The second resistance value is provided according to the sensed magnetic field in the second magnetic field sensing phase, and the arithmetic device generates the second voltage difference of the second magnetic field sensing phase according to the additional current provided by the current generator. The arithmetic device generates the magnetic field sensing voltage result according to the first and second voltage differences. According to the invention, only one magnetic field sensing apparatus is required to complete the magnetic field sensing operation, and thus the design layout area is reduced. In addition, the magnetic field sensing apparatus of the invention reduces the system electrical offset and the influence of environmental interference, which improves the signal-to-noise ratio of the sensing apparatus.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A magnetic field sensing apparatus, comprising:
   an anisotropic magnetoresistive resistor configured to provide a first resistance value according to a sensed magnetic field in a first magnetic field sensing phase and provide a second resistance value according to the sensed magnetic field in a second magnetic field sensing phase by a magnetized direction setting operation, wherein the first resistance value and the second resistance value are different;
   a current generator coupled to the anisotropic magnetoresistive resistor and providing a current to flow through two ends of the anisotropic magnetoresistive resistor according to a current direction; and
   an arithmetic device having a first input end and a second input end respectively coupled to the two ends of the anisotropic magnetoresistive resistor and performing an arithmetic operation on a first voltage difference and a second voltage difference which are generated by the anisotropic magnetoresistive resistor according to the current respectively in the first magnetic field sensing phase and the second magnetic field sensing phase, and generating a magnetic field sensing voltage result accordingly.

2. The magnetic field sensing apparatus according to claim 1, wherein the magnetized direction setting operation sets a magnetized direction of the anisotropic magnetoresistive resistor to a first setting direction in the first magnetic field sensing phase and sets the magnetized direction of the anisotropic magnetoresistive resistor to a second setting direction in the second magnetic field sensing phase, and the first setting direction and the second setting direction are opposite to each other.

3. The magnetic field sensing apparatus according to claim 2, wherein the first setting direction is the same as or opposite to the current direction.

4. The magnetic field sensing apparatus according to claim 1, wherein the arithmetic device comprises:
   an error amplifier having the first input end and the second input end respectively coupled to the two ends of the anisotropic magnetoresistive resistor and configured to provide the first voltage difference according to voltages of the two ends of the anisotropic magnetoresistive resistor in the first magnetic field sensing phase, and provide the second voltage difference according to the voltages of the two ends of the anisotropic magnetoresistive resistor in the second magnetic field sensing phase;
   a temporary storage device coupled to an output end of the error amplifier and configured to store the first voltage difference; and
   an arithmetic operator coupled to the temporary storage device and the error amplifier and configured to receive the first voltage difference and the second voltage difference and perform the arithmetic operation with respect to the first voltage difference and the second voltage difference to generate the magnetic field sensing voltage result.

5. The magnetic field sensing apparatus according to claim 4, wherein the temporary storage device is configured to store the first voltage difference and the second voltage difference.

6. The magnetic field sensing apparatus according to claim 1, wherein the anisotropic magnetoresistive resistor comprises at least one first sub-anisotropic magnetoresistive resistor and at least one second sub-anisotropic magnetoresistive resistor that are connected in series between the first input end and the second input end of the arithmetic device.

7. The magnetic field sensing apparatus according to claim 6, wherein the magnetized direction setting operation sets a magnetized direction of the at least one first sub-anisotropic magnetoresistive resistor to a first setting direction and sets a magnetized direction of the at least one second sub-anisotropic magnetoresistive resistor to a second setting direction in the first magnetic field sensing phase, and sets the magnetized direction of the at least one first sub-anisotropic magnetoresistive resistor to a third setting direction and sets the magnetized direction of the at least one second sub-anisotropic magnetoresistive resistor to a fourth setting direction in the second magnetic field sensing phase,
wherein the first setting direction and the second setting direction are the same or opposite, and
wherein the first setting direction and the third setting direction are opposite, and the second setting direction and the fourth setting direction are opposite.

8. The magnetic field sensing apparatus according to claim 7, wherein the first setting direction is the same as or opposite to the current direction.

9. A magnetic field sensing method, comprising:
providing a current to flow through two ends of an anisotropic magnetoresistive resistor according to a current direction;
configuring the anisotropic magnetoresistive resistor to provide a first resistance value according to a sensed magnetic field and generate a first voltage difference according to the current in a first magnetic field sensing phase by a magnetized direction setting operation;
configuring the anisotropic magnetoresistive resistor to provide a second resistance value according to the sensed magnetic field and generate a second voltage difference according to the current in a second magnetic field sensing phase by the magnetized direction setting operation; and
performing an arithmetic operation according to the first voltage difference and the second voltage difference, and generating a magnetic field sensing voltage result accordingly.

10. The magnetic field sensing method according to claim 9, wherein configuring the anisotropic magnetoresistive resistor to provide the first resistance value according to the sensed magnetic field in the first magnetic field sensing phase by the magnetized direction setting operation comprises:
setting a magnetized direction of the anisotropic magnetoresistive resistor to a first setting direction in the first magnetic field sensing phase by the magnetized direction setting operation; and
configuring the anisotropic magnetoresistive resistor to provide the second resistance value according to the sensed magnetic field in the second magnetic field sensing phase by the magnetized direction setting operation comprises:
setting the magnetized direction of the anisotropic magnetoresistive resistor to a second setting direction in the second magnetic field sensing phase by the magnetized direction setting operation,
wherein the first setting direction and the second setting direction are opposite.

11. The magnetic field sensing method according to claim 10, wherein the first setting direction is the same as or opposite to the current direction.

12. The magnetic field sensing method according to claim 10, wherein configuring the anisotropic magnetoresistive resistor to provide the first resistance value according to the sensed magnetic field and generate the first voltage difference according to the current in the first magnetic field sensing phase by the magnetized direction setting operation further comprises:
providing the first voltage difference according to a difference between voltages of the two ends of the anisotropic magnetoresistive resistor in the first magnetic field sensing phase; and
temporarily storing the first voltage difference;
configuring the anisotropic magnetoresistive resistor to provide the second resistance value according to the sensed magnetic field and generate the second voltage difference according to the current in the second magnetic field sensing phase by the magnetized direction setting operation further comprises:
providing the second voltage difference according to the difference between the voltages of the two ends of the anisotropic magnetoresistive resistor in the second magnetic field sensing phase.

13. The magnetic field sensing method according to claim 12, further comprising:
temporarily storing the second voltage difference.

14. The magnetic field sensing method according to claim 9, further comprising:
providing at least one first sub-anisotropic magnetoresistive resistor and at least one second sub-anisotropic magnetoresistive resistor that are connected in series to form the anisotropic magnetoresistive resistor.

15. The magnetic field sensing method according to claim 14, wherein configuring the anisotropic magnetoresistive resistor to provide the first resistance value according to the sensed magnetic field in the first magnetic field sensing phase by the magnetized direction setting operation comprises:
setting a magnetized direction of the at least one first sub-anisotropic magnetoresistive resistor to a first setting direction and setting a magnetized direction of the at least one second sub-anisotropic magnetoresistive resistor to a second setting direction in the first magnetic field sensing phase by the magnetized direction setting operation, wherein the first setting direction and the second setting direction are the same or opposite; and
configuring the anisotropic magnetoresistive resistor to provide the second resistance value according to the sensed magnetic field in the second magnetic field sensing phase by the magnetized direction setting operation comprises:
setting the magnetized direction of the at least one first sub-anisotropic magnetoresistive resistor to a third setting direction and setting the magnetized direction of the at least one second sub-anisotropic magnetoresistive resistor to a fourth setting direction in the second magnetic field sensing phase by the magnetized direction setting operation, wherein the first setting direction and the third setting direction are opposite, and the second setting direction and the fourth setting direction are opposite.

16. The magnetic field sensing method according to claim 15, wherein the first setting direction is the same as or opposite to the current direction.

* * * * *